United States Patent
Fuergut et al.

(10) Patent No.: US 12,438,063 B2
(45) Date of Patent: Oct. 7, 2025

(54) ELECTRONIC MODULE INCLUDING A SEMICONDUCTOR PACKAGE DISPOSED ON AN INTERPOSER LAYER

(71) Applicant: Infineon Technologies Austria AG, Villach (AT)

(72) Inventors: Edward Fuergut, Dasing (DE); Davide Chiola, Villach St. Georgen (AT); Martin Gruber, Schwandorf (DE); Wolfram Hable, Neumarkt (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/583,955

(22) Filed: Feb. 22, 2024

(65) Prior Publication Data

US 2024/0194566 A1 Jun. 13, 2024

Related U.S. Application Data

(63) Continuation of application No. 17/151,267, filed on Jan. 18, 2021, now Pat. No. 11,955,407.

(30) Foreign Application Priority Data

Jan. 20, 2020 (EP) .................................... 20152688

(51) Int. Cl.
*H01L 23/473* (2006.01)
*H01L 25/07* (2006.01)
(52) U.S. Cl.
CPC .......... *H01L 23/473* (2013.01); *H01L 25/072* (2013.01)

(58) Field of Classification Search
CPC . H01L 23/46–473; H01L 23/538–5389; H01L 25/072
See application file for complete search history.

(56) References Cited

U.S. PATENT DOCUMENTS

| | | | |
|---|---|---|---|
| 4,712,609 | A | 12/1987 | Iversen |
| 6,310,775 | B1 | 10/2001 | Nagatomo et al. |
| 10,872,835 | B1 | 12/2020 | Yoo et al. |
| 2005/0083652 | A1 | 4/2005 | Jairazbhoy et al. |
| 2008/0160246 | A1 | 7/2008 | Buhler et al. |
| 2014/0246768 | A1 | 9/2014 | Soyano |
| 2014/0327128 | A1 | 11/2014 | Yoo et al. |
| 2016/0336390 | A1 | 11/2016 | Hamada et al. |

(Continued)

FOREIGN PATENT DOCUMENTS

| | | |
|---|---|---|
| AT | 515440 A1 | 9/2015 |
| CN | 102414816 A | 4/2012 |

(Continued)

*Primary Examiner* — Tucker J Wright
(74) *Attorney, Agent, or Firm* — Murphy, Bilak & Homiller, PLLC

(57) ABSTRACT

An electronic module includes a semiconductor package including a die carrier, a semiconductor transistor die disposed on the die carrier, an electrical conductor connected to the semiconductor die, and an encapsulant covering the die carrier, the semiconductor die, and the electrical conductor so that a portion of the electrical conductor extends to the outside of the encapsulant. The electronic module further includes an interposer layer on which the semiconductor package is disposed, and a heat sink through which a cooling medium can flow. The interposer layer is disposed on the heatsink.

20 Claims, 7 Drawing Sheets

(56) References Cited

U.S. PATENT DOCUMENTS

2017/0271239 A1* 9/2017 Morozumi .............. H01L 21/50
2017/0309544 A1   10/2017 Kobayashi et al.
2020/0006190 A1    1/2020 Manninen et al.

FOREIGN PATENT DOCUMENTS

| CN | 110431662 A | 11/2019 |
| DE | 202014002028.0 U1 | 6/2015 |
| DE | 102015115133 B3 | 11/2016 |
| EP | 3166140 A1 | 5/2017 |
| EP | 3200225 A2 | 8/2017 |
| EP | 2477217 B1 | 5/2019 |
| FR | 3060847 A1 | 6/2018 |
| JP | 2006100640 A | 4/2006 |
| WO | 2018184948 A1 | 10/2018 |

* cited by examiner 1-phase Full Bridge 3-level Vienna

ELECTRONIC MODULE INCLUDING A SEMICONDUCTOR PACKAGE DISPOSED ON AN INTERPOSER LAYER

TECHNICAL FIELD

The present disclosure is related to an electronic module comprising a semiconductor package connected to a fluid heat sink.

BACKGROUND

The power density increase is a major trend within the power semiconductor market. Traditional applications like uninterruptible power source (UPS) or upcoming applications like Electric Vehicle (EV) Charging are based on a modular approach: single modules of lower power, standard size and footprint are connected in series to scale-up the output power of the final system. Therefore, one cost-effective way to increase the system output power is to increase the power density of the individual module.

Nowadays a typical semiconductor power module is constructed on the basis of a semiconductor bare die assembly which is often connected with problems like a high development effort and limited flexibility. It is therefore an object of the present disclosure to lower the development efforts and to increase the flexibility in building up the semiconductor power module.

SUMMARY

An aspect of the present disclosure is related to an electronic module comprising a semiconductor package comprising a die carrier, a semiconductor transistor die disposed on the die carrier, at least one electrical conductor connected to the semiconductor die, and an encapsulant covering the die carrier, the semiconductor die, and the electrical conductor so that a portion of the electrical conductor extends to the outside of the encapsulant, the electronic module further comprises an interposer layer, wherein the semiconductor package is disposed on the interposer layer, and a heat sink through which a cooling medium can flow, wherein the interposer layer is disposed on the heatsink.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of the embodiments will be readily appreciated as they become better understood by reference to the following detailed description.

The elements of the drawings are not necessarily to scale relative to each other. Like reference numerals designate corresponding similar parts.

DETAILED DESCRIPTION

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e., that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g., placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g., placed, formed, deposited, etc.) "directly on", e.g., in direct contact with, the implied surface.

Figure 1:
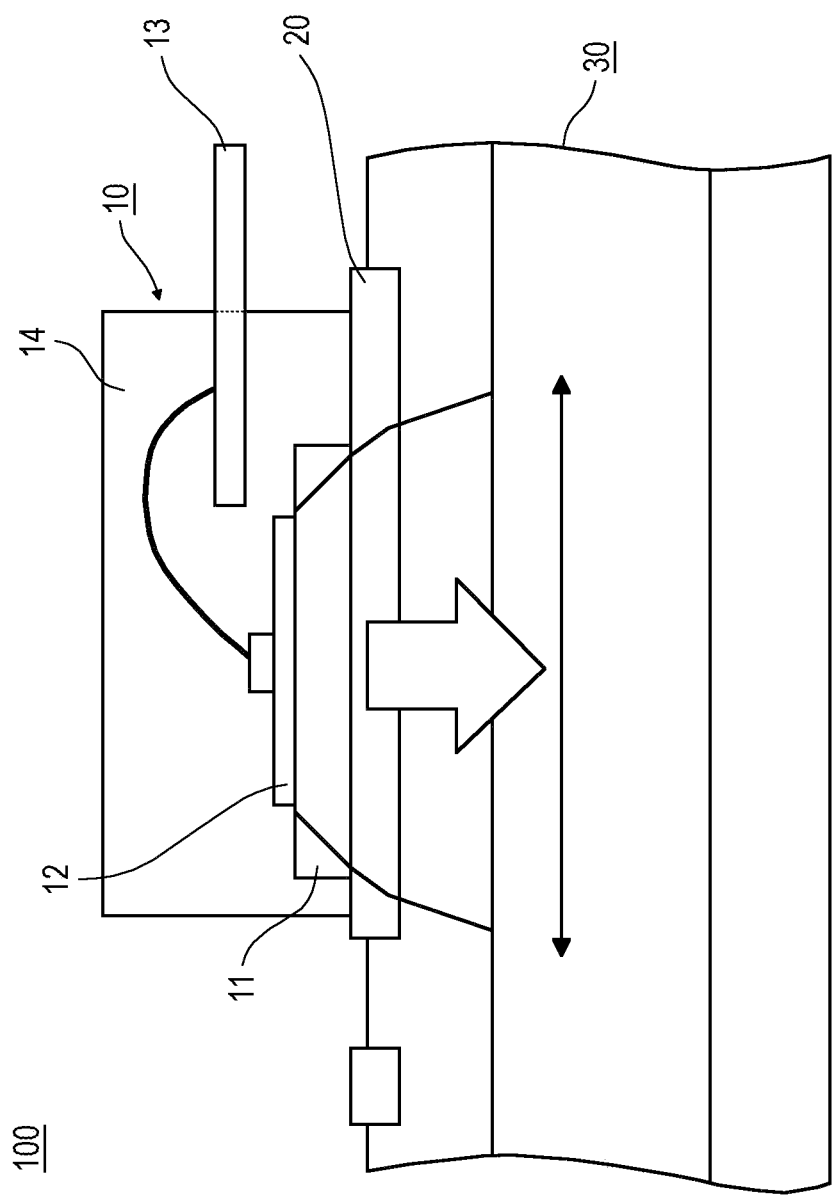
FIG. 1 shows a cross-sectional side view representation of an example of an electronic module according to the present disclosure, the electronic module comprising a single semiconductor package arranges on a fluid heatsink.

FIG. 1 shows a cross-sectional side view representation of an example of an electronic module according to the present disclosure.

The electronic module 100 of FIG. 1 comprises a semiconductor package 10 comprising a die carrier 11, a semiconductor die 12 disposed on the die carrier 11, at least one electrical conductor 13 connected to the semiconductor die 12, and an encapsulant 14 covering the die carrier 11, the semiconductor die 12, and the electrical conductor 13 so that a lower main face of the die carrier 11 is not covered by the encapsulant 14 and a portion of the electrical conductor 13 extends to the outside of the encapsulant 14. The electronic module 100 further comprises an interposer layer 20, wherein the semiconductor package 10 is disposed on the interposer layer 20, and a heat sink 30 through which a cooling medium can flow, wherein the interposer layer 20 is disposed on the heatsink 30. The die carrier 11 can be any one of a portion of a leadframe, an isolated metal substrate (IMS), a direct copper bond (DCB) substrate, or an active metal braze (AMB) substrate.

It can be seen in FIG. 1 that the electronic module 100 is configured such that the interposer layer 20 is partly embedded in an upper main face of the heatsink 30. It should be added that it can also be the case that the interposer layer 20 is completely embedded in the heat sink 30 so that an upper surface of the interposer layer 20 and an upper surface of the heatsink 30 are coplanar. In such a way not only the die carrier 11 but also the interposer layer 20 can act as a heat spreader by effectively dissipating the heat to the almost surrounding heat sink 30.

It should be added, however, that it can also be the case that the interposer layer 20 is not at all embedded in the heat sink 30 but rather attached onto an upper surface of the heat sink 30 so that an upper surface of the heat sink 30 is coplanar with a lower surface of the interposer layer 20.

According to an example of the electronic module 100 of FIG. 1, the interposer layer 20 is one of an isolated metal substrate (IMS), a direct copper bond (DCB) substrate, or an active metal braze (AMB) substrate.

According to an example of the electronic module 100 of FIG. 1, the interposer layer 20 is soldered or sintered onto the heatsink 30. According to a further example thereof, the interposer layer 20 is diffusion soldered onto the heatsink 30. According to another example the interposer layer 20 is connected to the heatsink 30 by use of a conductive glue, in particular a silver conductive glue.

According to an example of the electronic module 100 of FIG. 1, the semiconductor package 10 is soldered, in particular diffusion soldered, or sintered onto the interposer layer 20 or connected to the interposer layer 20 by use of a conductive glue, in particular a silver conductive glue.

According to an example of the electronic module 100 of FIG. 1, a solder layer or sinter layer between the semiconductor package 10 and the interposer layer 20 is thicker than 10 µm.

According to an example of the electronic module 100 of FIG. 1, a solder layer or sinter layer between the interposer layer 20 and the heatsink 30 is thinner than 10 µm.

According to an example of the electronic module 100 of FIG. 1, a solder layer or sinter layer between the semiconductor package 10 and the interposer layer 20 is thicker than a solder layer or sinter layer between the interposer layer 20 and the heatsink 30.

According to an example of the electronic module 100 of FIG. 1, the semiconductor die 11 is one or more of a wide bandgap semiconductor die, a SiC die, or a GaN die.

According to an example of the electronic module 100 of FIG. 1, wherein the semiconductor die 11 is one or more of a semiconductor transistor die, a power semiconductor transistor die, a power IGBT die, a power MOSFET die, a semiconductor diode die, or a thyristor die.

According to an example of the electronic module 100 of FIG. 1, the electronic module 100 further comprises two or more semiconductor packages. According to an example thereof the semiconductor packages are essentially all the same like, for example, they all contain the same semiconductor transistor dies, in particular switches. For example, two semiconductor transistor switches can be connected in series or in parallel to each other. According to another example thereof, the semiconductor packages are different like, for example, they contain different transistor dies or switches or they contain at least one semiconductor transistor die or switch as well as at least one semiconductor diode die which may be connected in parallel to the semiconductor transistor switch.

According to an example of the electronic module 100 of FIG. 1, the electronic module 100 further comprises two or more interposer layers, wherein at least one interposer layer carries only one semiconductor package, and at least one interposer layer carries two or more semiconductor packages.

According to an example of the electronic module 100 of FIG. 1, the semiconductor packages are connected with each other to form one or more of a DC/DC circuit, a DC/AC circuit, an AC/DC circuit, a half-bridge circuit, a full-bridge circuit, or a Vienna rectifier circuit.

According to an example of the electronic module 100 of FIG. 1, the semiconductor package 10 is a discrete or standardized package. Such a semiconductor package usually contains only a small number of semiconductor dies as, for example, 1 or 2 semiconductor dies. Such semiconductor dies can be, for example, two serially connected IGBT dies or one IGBT die and a parallel connected diode die.

According to an example of the electronic module 100 of FIG. 1, the semiconductor package 10 is one or more of a TO package, a TO220 package, a TO247 package, a TO263 package, or a D2PAK package.

According to an example of the electronic module 100 of FIG. 1, the heatsink 30 comprises a first main face and a second main face opposite to the first main face, wherein semiconductor packages are disposed on only one of the first or second main faces.

According to an example of the electronic module 100 of FIG. 1, the heatsink 30 comprises a first main face and a second main face opposite to the first main face, wherein semiconductor packages are disposed on both the first and second main faces.

According to an example of the electronic module 100 of FIG. 1, the cooling medium is a liquid cooling medium, in particular water. In particular, cooling with water will be employed when the switching power of the module will exceed a certain power threshold. The power threshold lies typically at about 100 kW but, however, also depends on the size, the structure, and the special application of the particular electronic module.

According to an example of the electronic module 100 of FIG. 1, the cooling medium is nonconductive.

According to an example of the electronic module 100 of FIG. 1, the heatsink 30 is one or more of conductive, nonconductive, organic, or inorganic.

According to an example of the electronic module 100 of FIG. 1, the die carrier 11 is thicker than the interposer layer 20.

According to an example of the electronic module 100, so that a lower main face of the die carrier is not covered by the encapsulant. Such an example is shown in FIG. 1. However, it is also possible that also the lower main face of the die carrier is covered by the encapsulant.

According to an example of the electronic module 100, the electronic module further comprises one or more control boards including one or more controller chips which control the electronic circuit which is built up by the semiconductor dies of the semiconductor packages. In particular, the controller chips may be driver chips which drive the gates of the semiconductor transistor chips.

According to an example of the electronic module 100, the electronic module further comprises connectivity devices configured to connect the module to external entities. These connectivity devices can be, for example, a WiFi module or a USB interface, and they can be included in the one or more control boards.

According to an example of the electronic module 100, the electronic module further comprises a further encapsulant which can be disposed on the one or more semiconductor packages.

FIGS. 2A to 2D illustrate the assembly of an example of an electronic module comprising a number of semiconductor packages arranged on one side of a fluid heatsink inclusive a control board on top.

Figure 2A:
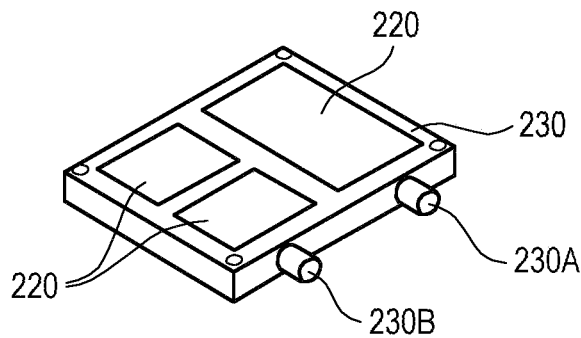
FIGS. 2A to 2D illustrate the assembly of an example of an electronic module comprising a number of semiconductor packages arranged on one side of a fluid heatsink inclusive control boards on top and bottom.

FIG. 2A shows a perspective view of an intermediate product comprising a fluid heatsink 230 onto which three interposer layers 220 are disposed. The heatsink 230 is comprised of a hollow flat rectangular body having two opposing main faces and four side faces connecting the two main faces with each other. The heatsink 230 further comprises in one of the side faces an inlet port 230A and an outlet port 230B for a liquid medium like, for example, water to flow through the heatsink 230. The inlet and outlet ports 230A and 230B can be connected to an external cooling circuit.

Figure 2B:
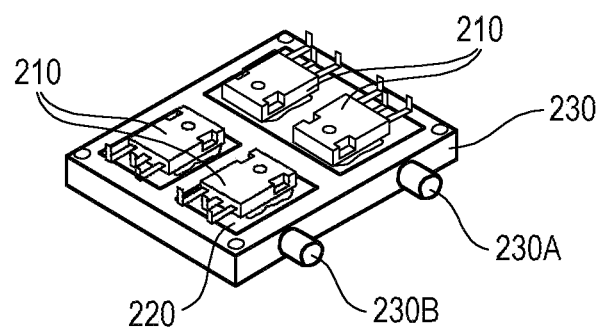

FIG. 2B shows the intermediate product after applying semiconductor packages 210 onto the interposer layers 220. The semiconductor packages 210 can be, for example, of the type TO220, TO247, TO263, D2PAK or the like. The interposer layers 220 are configured such that one of them is larger than the two others so that it can receive two semiconductor packages 210 on an upper main face thereof, whereas the other two smaller interposer layers 220 can receive only one semiconductor package 210, respectively. It will be shown later that the semiconductor dies of the semiconductor packages 210 can be interconnected to form an electronic circuit.

Figure 2C:
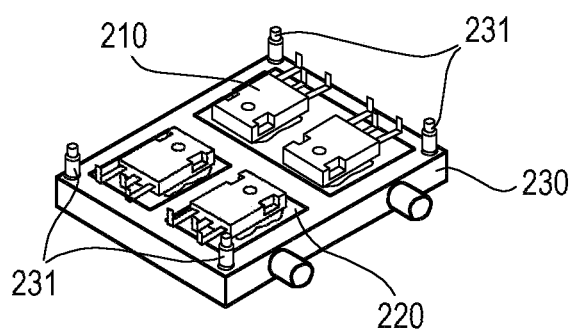

FIG. 2C shows the intermediate product after applying mounting posts 231 at the four corners of the upper main face of the heatsink 230.

Figure 2D:
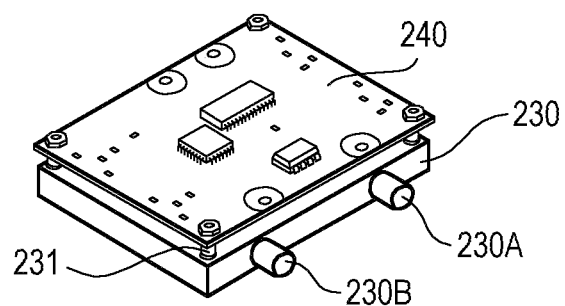

FIG. 2D shows the intermediate product after securing a control board 240 to the mounting posts 231. The control board 240 may include one or more controller chips 241 which control the electronic circuit which is built up by the semiconductor dies of the semiconductor packages 210. The control board 240 can be formed, for example, by a printed circuit board (PCB).

FIGS. 3A to 3E illustrate the assembly of an example of an electronic module comprising a number of semiconductor packages arranged on two opposing sides of a fluid heat sink inclusive control boards on top and bottom.

Figure 3A:
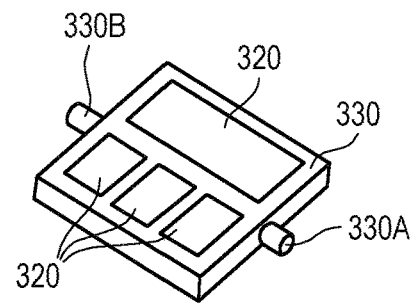
FIGS. 3A to 3E illustrate the assembly of an example of an electronic module comprising a number of semiconductor packages arranged on two opposing sides of a fluid heat sink inclusive control board on top and bottom.
Figure 3B:
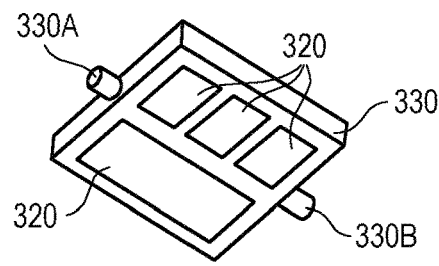
Figure 3C:
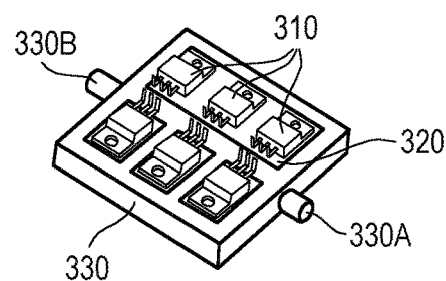
Figure 3D:
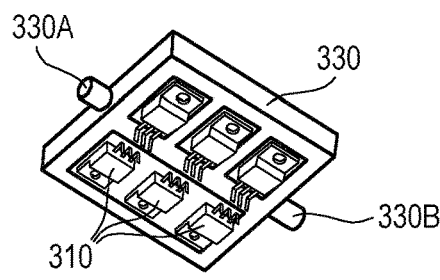

FIGS. 3A and 3B show perspective views from above and below of an intermediate product comprising a fluid heatsink 330 which is comprised of a hollow flat rectangular body having two opposing main faces and four side faces connecting the two main faces with each other. On each one of the two opposing main faces four interposer layers 320 are disposed. The heatsink 330 further comprises in the opposing side faces an inlet port 330A and an outlet port 330B for a liquid medium like, for example, water to flow through the heatsink 330. The inlet and outlet ports 330A and 330B can be connected to an external cooling circuit.

FIGS. 3C and 3D again show the perspective views from above and below of an intermediate product and show the intermediate product after applying semiconductor packages 310 onto the interposer layers 320. The semiconductor packages 310 can be, for example, of the type TO220, TO247, TO263, D2PAK or the like. On both opposing main faces of the heatsink 330 the interposer layers 320 are configured such that one of them is larger than the three others so that it can receive three semiconductor packages 310 on an upper main face thereof, whereas the other three smaller interposer layers 320 can receive only one semiconductor package 310, respectively.

Figure 3E:
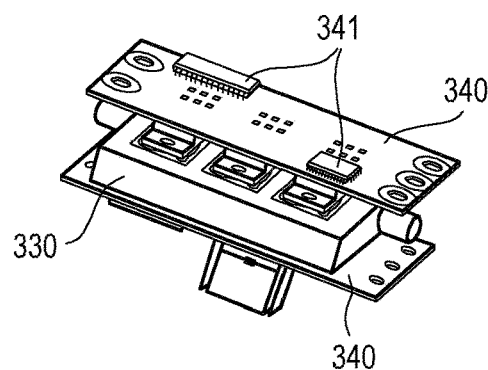

FIG. 3E shows the intermediate product after securing two control boards 340 to the module, one on each side of it. Each one of the control boards 340 may include one or more controller chips 341 which control the electronic circuit which is built up by the semiconductor dies of the semiconductor packages 310. Each one of the control boards 340 can be formed, for example, by a printed circuit board (PCB).

FIGS. 4A to 4D illustrate the assembly of an example of an electronic module comprising a number of semiconductor packages arranged on an aluminum fluid heatsink with an embedded isolator.

Figure 4A:
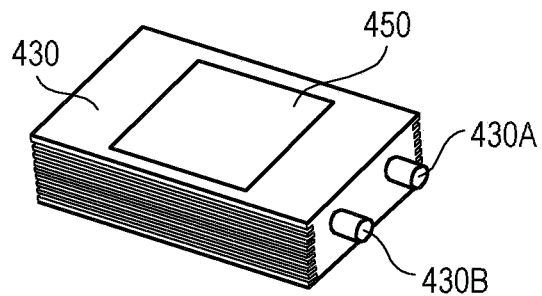
FIGS. 4A to 4D illustrate the assembly of an example of an electronic module comprising a number of semiconductor packages arranged on an aluminum fluid heatsink with an embedded isolator and a control board on top.

FIG. 4A shows a perspective view of an intermediate product comprising a fluid heatsink 430. The heatsink 430 is comprised of a hollow flat rectangular body made of aluminum or an aluminum alloy and having two opposing main faces and four side faces connecting the two main faces with each other. The heatsink 430 further comprises in one of the side faces an inlet port 430A and an outlet port 430B for a liquid medium like, for example, water to flow through the heatsink 430. The inlet and outlet ports 430A and 430B can be connected to an external cooling circuit. On an upper main face of the heatsink 430 an isolator layer 450 is disposed. The isolator layer 450 can be made of a ceramic material and it can be embedded into the upper main face of the heatsink 430.

Figure 4B:
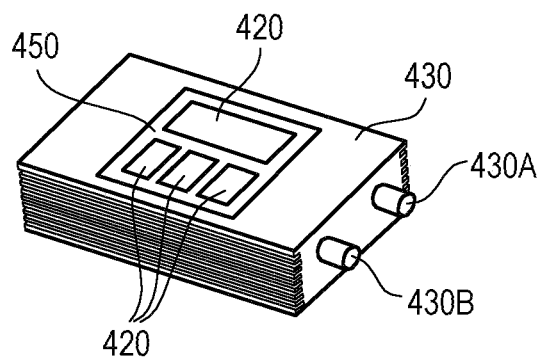

FIG. 4B shows the intermediate product after disposing four interposer layers 420 onto the isolator layer 450.

Figure 4C:
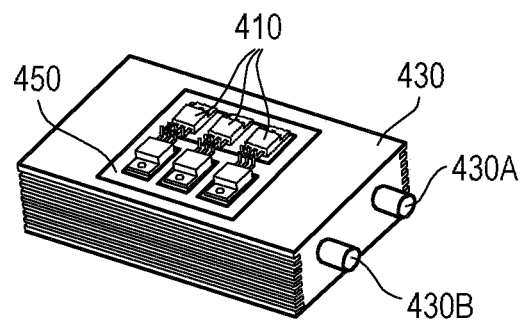

FIG. 4C shows the intermediate product after applying semiconductor packages 410 onto the interposer layers 420. The interposer layers 420 can configured such that one of them is larger than the three others so that it can receive three semiconductor packages 410 on an upper main face thereof, whereas the other three smaller interposer layers 420 can receive only one semiconductor package 410, respectively.

Figure 4D:
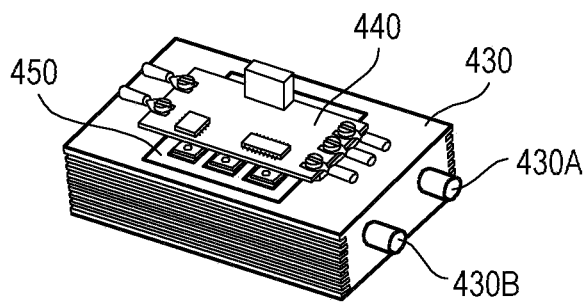

FIG. 4D shows the intermediate product after securing a control board 440 to heatsink 430. The control board 440 may include one or more controller chips 441 which control the electronic circuit which is built up by the semiconductor dies of the semiconductor packages 410. The control board 440 can be formed, for example, by a printed circuit board (PCB).

FIGS. 5A to 5D illustrate the assembly of an example of an electronic module comprising a number of semiconductor packages arranged on a fluid heatsink inclusive mounting frame for control unit and resin casting.

Figure 5A:
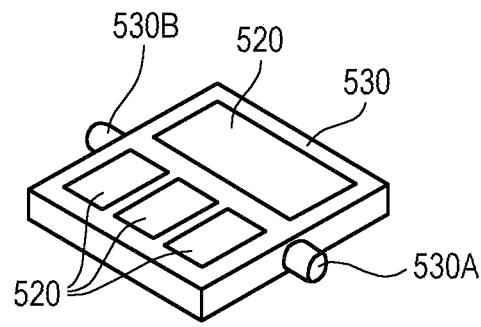
FIGS. 5A to 5D illustrate the assembly of an example of an electronic module comprising a number of semiconductor packages arranged on a fluid heatsink inclusive mounting frame for control unit and resin casting.

FIG. 5A shows a perspective view from above on an intermediate product comprising a fluid heatsink 530 which is comprised of a hollow flat rectangular body having two opposing main faces and four side faces connecting the two main faces with each other. On an upper main face of the heatsink 530 four interposer layers 520 are disposed. The heatsink 530 further comprises in the opposing side faces an inlet port 530A and an outlet port 530B for a liquid medium like, for example, water to flow through the heatsink 530. The inlet and outlet ports 530A and 530B can be connected to an external cooling circuit.

Figure 5B:
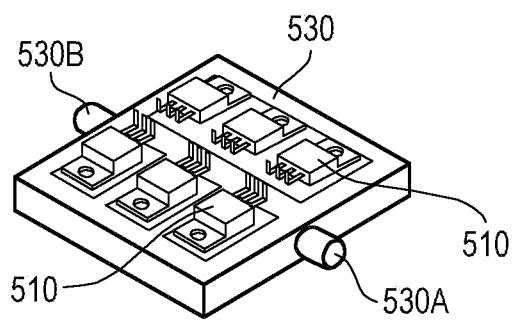

FIG. 5B shows the perspective view from above on the intermediate product and shows the intermediate product after applying semiconductor packages 510 onto the interposer layers 520. The semiconductor packages 510 can be, for example, of the type TO247, TO247PLUS, D2PAK or the like. The interposer layers 520 are configured such that one of them is larger than the three others so that it can receive three semiconductor packages 510 on an upper main face thereof, whereas the other three smaller interposer layers 520 can receive only one semiconductor package 510, respectively.

Figure 5C:
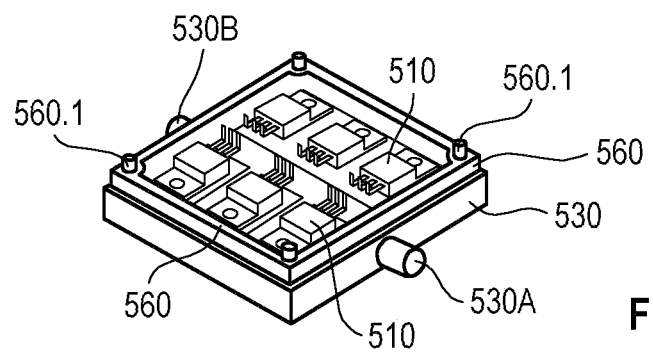

FIG. 5C shows the intermediate product after attaching a mounting frame 560 to the module. The mounting frame 560 comprises a rectangular ring-like shape composed of four frame bars extending along the four edges of the upper surface of the heatsink 530. The mounting frame 560 further comprises four mounting posts 560.1 disposed on the four edges of the mounting frame 560.

Before the next step of mounting the control board 540, it is possible to fill the inner volume of the module with an encapsulant as, for example, a resin, in particular an epoxy resin, or silicone, for improving the electrical insulation and to increase the reliability with this, if necessary.

Figure 5D:
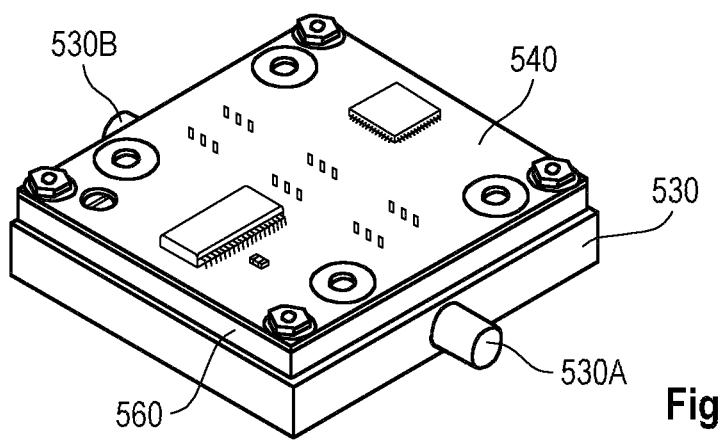

FIG. 5D shows the intermediate product after securing a control board 540 to the mounting posts 560.1. The control board 540 may include one or more controller chips 541 which control the electronic circuit which is built up by the semiconductor dies of the semiconductor packages 510. The control board 540 can be formed, for example, by a printed circuit board (PCB).

FIGS. 6A to 6D illustrate the fabrication of an assembly of a number of electronic modules each one of which comprising a number of semiconductor packages arranged on one side of a fluid heatsink, the assembly including a control board on top.

Figure 6A:
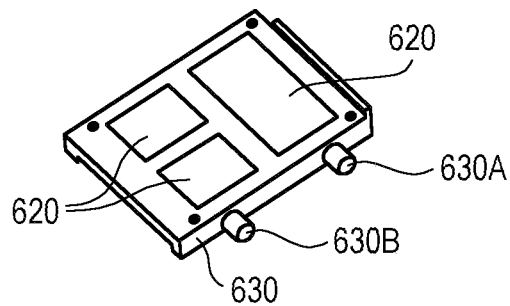
FIGS. 6A to 6D illustrate the fabrication of a complete system consisting of an assembly of a number of electronic sub-modules each one of which comprising a number of semiconductor packages arranged on one side of a fluid heatsink, the assembly including a control board on top.

FIG. 6A shows a perspective view of an intermediate product comprising a fluid heatsink 630 onto which three interposer layers 620 are disposed. The heatsink 630 is comprised of a hollow flat rectangular body having two opposing main faces and four side faces connecting the two main faces with each other. The heatsink 630 further comprises in one of the side faces an inlet port 630A and an outlet port 630B for a liquid medium like, for example, water to flow through the heatsink 630. The inlet and outlet ports 630A and 630B can be connected to an external cooling circuit.

Figure 6B:
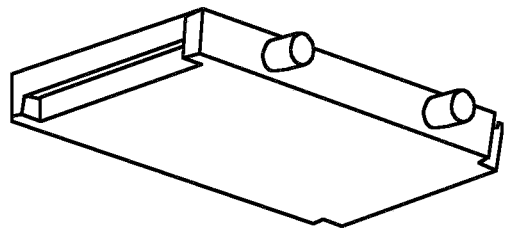

FIG. 6B shows a perspective view from below of the intermediate product.

Figure 6C:
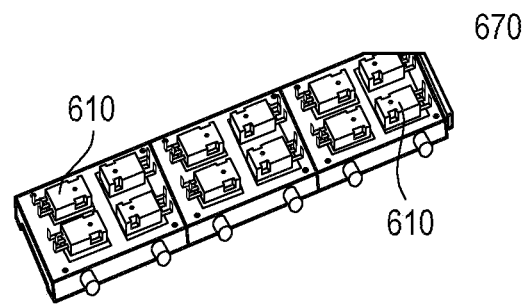

FIG. 6C shows a perspective view from above of an intermediate product comprising an assembly 670 of three intermediate products of the type as shown in FIGS. 6A and 6B, the intermediate products laterally connected together with equal directional orientations so that the inlet and outlet ports 630A and 630B are all disposed on one of the side faces of the assembly. Before connecting the three intermediate products together, semiconductor packages 610 were applied onto the interposer layers 620 of all heatsinks 630.

Figure 6D:
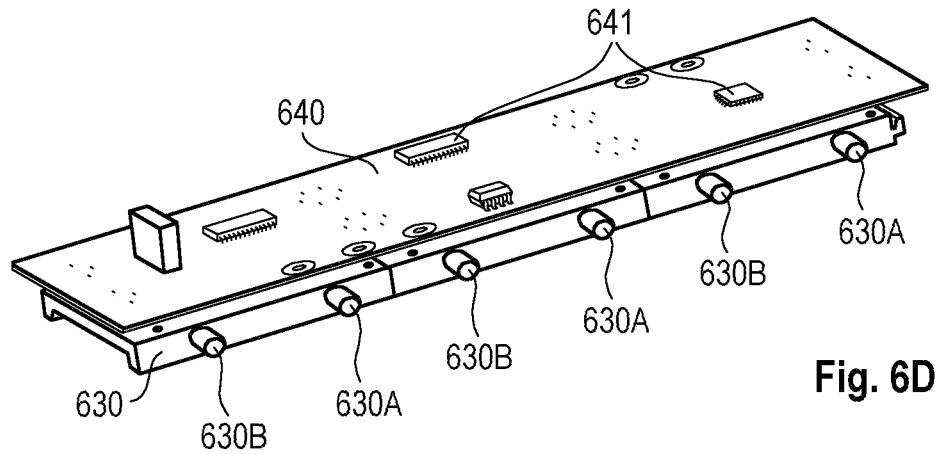

FIG. 6D shows the electronic module after securing a control board 640 to the assembly. The control board 640 may include one or more controller chips 641 which control the electronic circuits which are built up by the semiconductor dies of the semiconductor packages 610. The control board 640 can be formed, for example, by a printed circuit board (PCB).

FIGS. 7A to 7C show again the electronic module of FIG. 2C (A) and two possible circuit configurations which could be realized with the electronic module, namely a 1-phase full bridge circuit (B), and 3-level Vienna circuit (C).

Figure 7A:
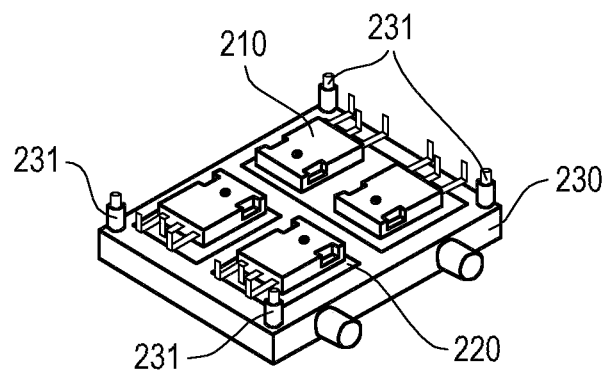
FIGS. 7A to 7C show again the electronic module of FIG. 2C (A) and two possible circuit configurations or topologies which could be realized with the electronic module, namely a 1-phase full bridge circuit (B), and a 3-level Vienna circuit (C).

FIG. 7A corresponds to FIG. 2C and shows the intermediate product after applying mounting posts 231 at the four corners of the upper main face of the heatsink 230. The intermediate product is configured such that two semiconductor packages 210 are disposed on one of the interposer layers 220 and the other two semiconductor packages 210 are each disposed on only one interposer layer 220, respectively.

Figure 7B:
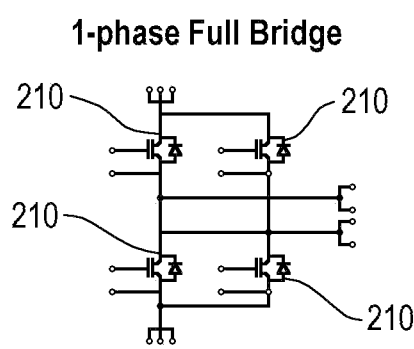

FIG. 7B shows a 1-phase full bridge circuit which could be realized with the intermediate product as shown in FIG. 7A. In this case the full bridge circuit comprises four IGBT or MOSFET transistors which correspond to the four semiconductor packages 210 disposed on the interposer layers 220.

Figure 7C:
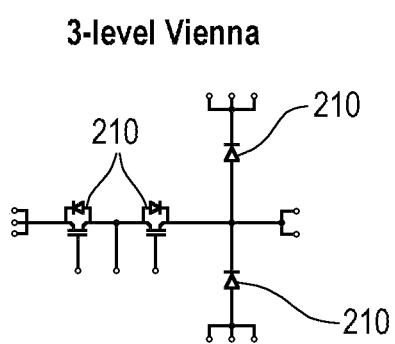

FIG. 7C shows a 3-Level Vienna circuit which could alternatively be realized with the intermediate product as shown in FIG. 7A. In this case the Vienna circuit comprises two IGBT or MOSFET transistors and two diodes which correspond to the four semiconductor packages 210 disposed on the interposer layers 220.

A further example of a circuit topology which could be realized with the intermediate product as shown, for example, in FIG. 2A, is the so-called neutral point clamped (NPC) structure, a classic version of which also contains four IGBT transistors.

Example 1 is an electronic module, comprising a semiconductor package, comprising a die carrier, a semiconductor die disposed on the die carrier, at least one electrical conductor connected to the semiconductor die, and an encapsulant covering the die carrier, the semiconductor die, and the electrical conductor so that a portion of the electrical conductor extends to the outside of the encapsulant, an interposer layer, wherein the semiconductor package is disposed on the interposer layer, and a heat sink through which a cooling medium can flow, wherein the interposer layer (20) is disposed on the heatsink.

In Example 2, the subject matter of Example 1 can optionally further include that the die carrier is one of a portion of a leadframe, an isolated metal substrate (IMS), a direct copper bond (DCB) substrate, or an active metal braze (AMB) substrate.

In Example 3, the subject matter of Example 1 or 2 can optionally further include that the interposer layer is one of an isolated metal substrate (IMS), a direct copper bond (DCB) substrate, or an active metal braze (AMB) substrate.

In Example 4, the subject matter of any one of the preceding Examples can optionally further include that the interposer layer is embedded in an upper main face of the heatsink.

In Example 5, the subject matter of any one of the preceding Examples can optionally further include that the interposer layer is soldered, diffusion soldered, or sintered onto the heatsink, or connected to the heatsink by use of a glue, a conductive glue or a silver glue.

In Example 6, the subject matter of any one of the preceding Examples can optionally further include that the semiconductor package is soldered, diffusion soldered, or sintered onto the interposer layer, or connected to the interposer by use of a conductive glue, in particular a silver conductive glue.

In Example 7, the subject matter of any one of the preceding Examples can optionally further include that the semiconductor die is one or more of a wide band gap semiconductor die, a SiC die, or a GaN die.

In Example 8, the subject matter of any one of the preceding Examples can optionally further include that the semiconductor die is one or more of a semiconductor transistor die, a power semiconductor transistor die, a power IGBT die, a power MOSFET die, a semiconductor diode die, or a thyristor die.

In Example 9, the subject matter of any one of the preceding Examples can optionally further comprise two or more semiconductor packages.

In Example 10, the subject matter of any one of the preceding Examples can optionally further comprise two or more interposer layers, wherein at least one interposer layer carries only one semiconductor package, and at least one interposer layer carries two or more semiconductor package.

In Example 11, the subject matter of any one of the preceding Examples can optionally further include that the semiconductor packages are connected with each other to form one or more of a DC/DC circuit, a DC/AC circuit, an AC/DC circuit, a half-bridge circuit, a full-bridge circuit, or a Vienna rectifier circuit.

In Example 12, the subject matter of any one of the preceding Examples can optionally further include that the semiconductor package is one or more of a discrete or standardized package, a discrete or standardized power package, a TO package, a TO220 package, a TO247 package, a TO263 package, or a D2PAK package.

In Example 13, the subject matter of any one of the preceding Examples can optionally further include that the heatsink comprises a first main face and a second main face opposite to the first main face, wherein the semiconductor packages are disposed on both the first and second main faces.

In Example 14, the subject matter of any one of the preceding Examples can optionally further include that the cooling medium is nonconductive.

In Example 15, the subject matter of any one of the preceding Examples can optionally further include that the heatsink is one or more of conductive, nonconductive, organic, or inorganic.

In Example 16, the subject matter of any one of the preceding Examples can optionally further include that the die carrier is thicker than the interposer layer.

In Example 17, the subject matter of any one of the preceding Examples can optionally further include that the inner volume of the module is filled with a further encapsulant as, for example, a resin, in particular an epoxy resin, or silicone.

In Example 18, the subject matter of any one of the preceding Examples can optionally further comprise a control board including one or more controller chips which control the electronic circuit which is built up by the semiconductor dies of the semiconductor packages.

In Example 19, the subject matter of any one of the preceding Examples can optionally further comprise connectivity devices configured to connect the module to external entities.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. An electronic module, comprising:
   a semiconductor package comprising a die carrier, a semiconductor die disposed on the die carrier, an electrical conductor connected to the semiconductor die, and an encapsulant covering the die carrier, the semiconductor die, and the electrical conductor so that a portion of the electrical conductor extends to the outside of the encapsulant;
   an interposer layer, wherein the semiconductor package is disposed on the interposer layer; and
   a heat sink,
   wherein the interposer layer is disposed on the heatsink,
   wherein the semiconductor package is soldered, diffusion soldered, or sintered onto the interposer layer, or connected to the interposer layer by a conductive glue or a silver conductive glue.

2. The electronic module of claim 1, wherein the die carrier is one of a portion of a leadframe, an isolated metal substrate, a direct copper bond substrate, or an active metal braze substrate.

3. The electronic module of claim 1, wherein the interposer layer is one of an isolated metal substrate, a direct copper bond substrate, or an active metal braze substrate.

4. The electronic module of claim 1, wherein the interposer layer is embedded in an upper main face of the heatsink.

5. The electronic module of claim 1, wherein the interposer layer is soldered, diffusion soldered, or sintered onto the heatsink, or connected to the heatsink by a glue, a conductive glue or a silver glue.

6. The electronic module of claim 1, wherein the semiconductor die is one or more of a wide band gap semiconductor die, a SiC die, or a GaN die.

7. The electronic module of claim 1, wherein the semiconductor die is one or more of a wide band gap semiconductor die, a SiC die, or a GaN die.

8. The electronic module of claim 1, further comprising two or more semiconductor packages.

9. The electronic module of claim 8, wherein the two of more semiconductor packages are connected with each other to form one or more of a DC/DC circuit, a DC/AC circuit, an AC/DC circuit, a half-bridge circuit, a full-bridge circuit, or a Vienna rectifier circuit.

10. The electronic module of claim 1, further comprising:
two or more interposer layers,
wherein at least one interposer layer carries only one semiconductor package, and
wherein at least one interposer layer carries two or more semiconductor packages.

11. The electronic module of claim 10, wherein the two or more semiconductor packages are connected with each other to form one or more of a DC/DC circuit, a DC/AC circuit, an AC/DC circuit, a half-bridge circuit, a full-bridge circuit, or a Vienna rectifier circuit.

12. The electronic module of claim 1, wherein the semiconductor package is one or more of a discrete or standardized package, a discrete or standardized power package, a TO package, a TO220 package, a TO247 package, a TO263 package, or a D2PAK package.

13. The electronic module of claim 1, wherein the heatsink comprises a first main face and a second main face opposite to the first main face, wherein the semiconductor package is disposed on the first main face of the heatsink, and wherein an additional semiconductor package is disposed on the second main face of the heatsink.

14. The electronic module of claim 1, wherein the cooling medium is nonconductive.

15. The electronic module of claim 1, wherein the heatsink is one or more of conductive, nonconductive, organic, or inorganic.

16. The electronic module of claim 1, wherein an inner volume of the electronic module is filled with a further encapsulant.

17. The electronic module of claim 1, further comprising a control board including one or more controller chips which control an electronic circuit which includes the semiconductor die of the semiconductor package.

18. The electronic module of claim 1, further comprising connectivity devices configured to connect the electronic module to external entities.

19. An electronic module, comprising:
a semiconductor package comprising a die carrier, a semiconductor die disposed on the die carrier, an electrical conductor connected to the semiconductor die, and an encapsulant covering the die carrier, the semiconductor die, and the electrical conductor so that a portion of the electrical conductor extends to the outside of the encapsulant;
an interposer layer, wherein the semiconductor package is disposed on the interposer layer; and
a heat sink,
wherein the interposer layer is disposed on the heatsink,
wherein the interposer layer is one of an isolated metal substrate (IMS), a direct copper bond (DCB) substrate or an active metal braze (AMB) substrate having a first side attached to the die carrier and a second side attached to or embedded in the heat sink.

20. An electronic module, comprising:
a semiconductor package comprising a die carrier, a semiconductor die disposed on the die carrier, an electrical conductor connected to the semiconductor die, and an encapsulant covering the die carrier, the semiconductor die, and the electrical conductor so that a portion of the electrical conductor extends to the outside of the encapsulant;
an interposer layer, wherein the semiconductor package is disposed on the interposer layer; and
a heat sink,
wherein the interposer layer is disposed on the heatsink,
wherein the semiconductor package is soldered, diffusion soldered, or sintered onto the interposer layer, or connected to the interposer layer by a conductive glue or a silver conductive glue,
wherein the die carrier is thicker than the interposer layer.

* * * * *